United States Patent
Smith et al.

(10) Patent No.: US 11,790,995 B2
(45) Date of Patent: Oct. 17, 2023

(54) MEMORY WITH A SOURCE PLATE DISCHARGE CIRCUIT

(71) Applicant: Micron Technology, Inc., Boise, ID (US)

(72) Inventors: Michael A. Smith, Boise, ID (US); Vladimir Mikhalev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/400,924

(22) Filed: Aug. 12, 2021

(65) Prior Publication Data

US 2023/0046480 A1 Feb. 16, 2023

(51) Int. Cl.
*G11C 16/04* (2006.01)
*G11C 16/14* (2006.01)
*H01L 29/735* (2006.01)

(52) U.S. Cl.
CPC .......... *G11C 16/14* (2013.01); *G11C 16/0483* (2013.01); *H01L 29/735* (2013.01)

(58) Field of Classification Search
CPC ............ G11C 16/3427; G11C 11/5628; G11C 11/5635; G11C 11/5671; G11C 16/0483; G11C 16/10; G11C 16/16; G11C 16/24; H01L 24/08; H01L 25/0657; H01L 25/18; H01L 2224/08145; H01L 2225/06506; H01L 2225/06541; H01L 2225/06562; H01L 2924/1431; H01L 2924/14511
USPC .................................................... 365/185.17
See application file for complete search history.

(56) References Cited

U.S. PATENT DOCUMENTS

| | | | |
|---|---|---|---|
| 7,541,648 B2 * | 6/2009 | Jin | ...................... H01L 27/0259 257/361 |
| 9,337,266 B2 | 5/2016 | Smith | |
| 9,847,335 B2 | 12/2017 | Smith | |
| 10,522,547 B2 | 12/2019 | Smith | |

* cited by examiner

*Primary Examiner* — Tha-O H Bui
(74) *Attorney, Agent, or Firm* — Perkins Coie LLP (57) ABSTRACT

Memory systems and devices with source plate discharge circuits (and associated methods) are described herein. In one embodiment, a memory device includes (a) a plurality of memory cells, (b) a source plate electrically coupled to the plurality of memory cells, and (c) a discharge circuit. The discharge circuit can include a bipolar junction transistor device electrically coupled to the source plate and configured to drop a voltage at the source plate by, for example, discharging current through the bipolar junction transistor device. In some embodiments, the bipolar junction transistor device can be activated using a low-voltage switch or a high-voltage switch electrically coupled to the bipolar junction transistor. In these and other embodiments, the bipolar junction transistor device can operate in an avalanche mode while discharging current to drop the voltage at the source plate.

20 Claims, 8 Drawing Sheets

MEMORY WITH A SOURCE PLATE DISCHARGE CIRCUIT

TECHNICAL FIELD

The present disclosure is related to memory systems, devices, and associated methods. In particular, the present disclosure is related to memory devices with source plate discharge circuits.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

As discussed in greater detail below, the technology disclosed herein relates to memory systems and devices (and associated methods) having circuits for quickly dropping voltages at source plates used, for example, to erase memory cells. For example, the present technology relates to discharge circuits that employ bipolar junction transistors (e.g., operating in an avalanche mode) to discharge large amounts of current and drop the voltages at the source plates. A person skilled in the art, however, will understand that the technology may have additional embodiments and that the technology may be practiced without several of the details of the embodiments described below with reference to FIGS. 1-6.

In the illustrated embodiments below, the memory devices are primarily described in the context of devices incorporating three-dimensional (3D) NAND-based storage media (e.g., 3D NAND flash). Memory devices configured in accordance with other embodiments of the present technology, however, can include other types of memory devices (e.g., NAND, phase change memory, ferroelectric, etc.) and/or can include main memories that are not NAND-based (e.g., NOR-based) or only partially NAND-based. Moreover, memory devices configured in accordance with still other embodiments of the present technology can include volatile memories, such as DRAM and/or SRAM memories.

In addition, discharge circuits of the present technology are primarily described below in the context of dropping a voltage at a source plate (a) as part of an operation to erase memory cells of a memory device, or (b) in response to an interruption of the erase operation. Discharge circuits of the present technology, however, can be used in other contexts. For example, discharge circuits of the present technology can be used to drop a voltage at a source plate during or after (or to interrupt) a read or write operation of a memory device. As another example, discharge circuits of the present technology can be used to drop voltages at other components (e.g., at other capacitors) of a memory system or device besides a source plate. As still another example, discharge circuits of the present technology can be used to discharge electrical components in other electronic systems and devices besides memory devices, including power distribution systems or other electronics that may or may not employ a memory device. Such other contexts and applications are within the scope of the present disclosure.

A. Overview

In many memory devices, such as those employing 3D NAND memory arrays, memory cells are arranged in memory regions (e.g., pages, blocks, planes, etc.). In each memory region, memory cells can be located at intersections of word lines and bit lines. The word lines of a memory region can be electrically coupled to a common electrical contact, known as a source plate. The source plate is relatively large in size and therefore has a relatively large capacitance in comparison to other components of the memory devices.

Source plates are commonly used to manage (e.g., read, write, erase, etc.) memory cells of corresponding memory arrays. For example, during erase operations of a memory region, all memory cells of the memory region are programmed to the same logic state. In particular, a memory device ramps a source plate corresponding to the memory region to a high voltage to pull word lines of the memory region that intersect the source plate to the high voltage, enabling the memory device to erase the corresponding memory cells. The memory device can then drop the voltage at the source plate back down to ground or to another low voltage to perform a test read to determine how much of the memory region has been successfully erased. The memory device can repeat this procedure (e.g., ramping the source plate to the high voltage to pull intersecting word lines to the high voltage, dropping the voltage at the source plate back down to ground or to the other low voltage, and performing a test read) as needed until, for example, each memory cell of the memory region has been successfully erased.

After the source plate has been energized to the high voltage, many memory devices employ a series of diode-configuration high-voltage (HV) n-channel MOSFET (NMOS) devices to drop the voltage at the source plate back to ground or to another low voltage. Use of a series of diode-configuration HV NMOS devices ensures that the voltage at the source plate is dropped in a stable and controlled manner. The series of diode-configuration HV NMOS devices, however, consumes a large amount of space on the memory device, and discharging the source plate in this manner is a relatively slow process (e.g., on the order of hundreds of microseconds).

In certain situations, a memory device may need to quickly drop a voltage at the source plate down to ground or another low voltage from a higher voltage. For example, a memory device may need to interrupt an erase operation in the event the memory device is experiencing a brownout or other power problem. As another example, the memory device may need to interrupt an erase operation to perform one or more other (e.g., more urgent, important, time-sensitive, etc.) operations.

One option to quickly drop the voltage at a source plate is to use a single HV NMOS device electrically coupled to the source plate. HV NMOS devices, however, often suffer from snapback when too much current is discharged across them. These devices can also self-destruct and/or inject charge onto neighboring (victim) lines. In turn, neighboring devices often experience snapback, latchup, or other damage when problems occur at the HV NMOS device due to large amounts of current. A ballast resistor can be used to stabilize the discharged current through the HV NMOS device and prevent many of the above negative effects, but ballast resistors consume a large amount of area on a memory device. Thus, absent a ballast resistor, the single HV NMOS device is most safely used when the voltage at the source plate is relatively low (e.g., 10V or less).

To address the above concerns, the present technology is generally directed to circuits that employ high-voltage bipolar junction transistor (BJT) devices to drop voltages at corresponding source plates. In some embodiments, the BJT devices can be operated in an avalanche mode that enables a large amount of current to pass through the device (a) without use of a ballast resistor and/or (b) without the aforementioned snapback, current injection, self-destruction, or other problems of HV NMOS devices. The avalanche operation mode also enables the circuits to drop voltages at the corresponding source plates more quickly (e.g., on the order of tens of microseconds) than the series of diode-configuration HV NMOS devices used in many memory devices. This enables the memory device to (a) more quickly execute erase and/or other operations, (b) more quickly transition to executing another operation (e.g., immediately) after executing the erase and/or other operations, and/or (c) more quickly respond to operation interrupt or abort commands, brownout or other power problems, and/or other time-sensitive conditions. Furthermore, the BJT devices are relatively small in comparison to the series of HV NMOS devices and ballast resistors, and therefore consume a relatively small amount of space on the memory device. As discussed in greater detail below, the BJT devices can be controlled with low-voltage and/or high-voltage switches.

In these and other embodiments, the BJT devices can be used to drop voltages on source plates to voltage values that can be safely handled by HV NMOS devices. Thus, in these embodiments, a BJT device can first be used to drop a voltage at a source plate below a threshold voltage value. A HV NMOS device can then be used to drop the remaining voltage at the source plate to ground or another voltage value.

Figure 1A:
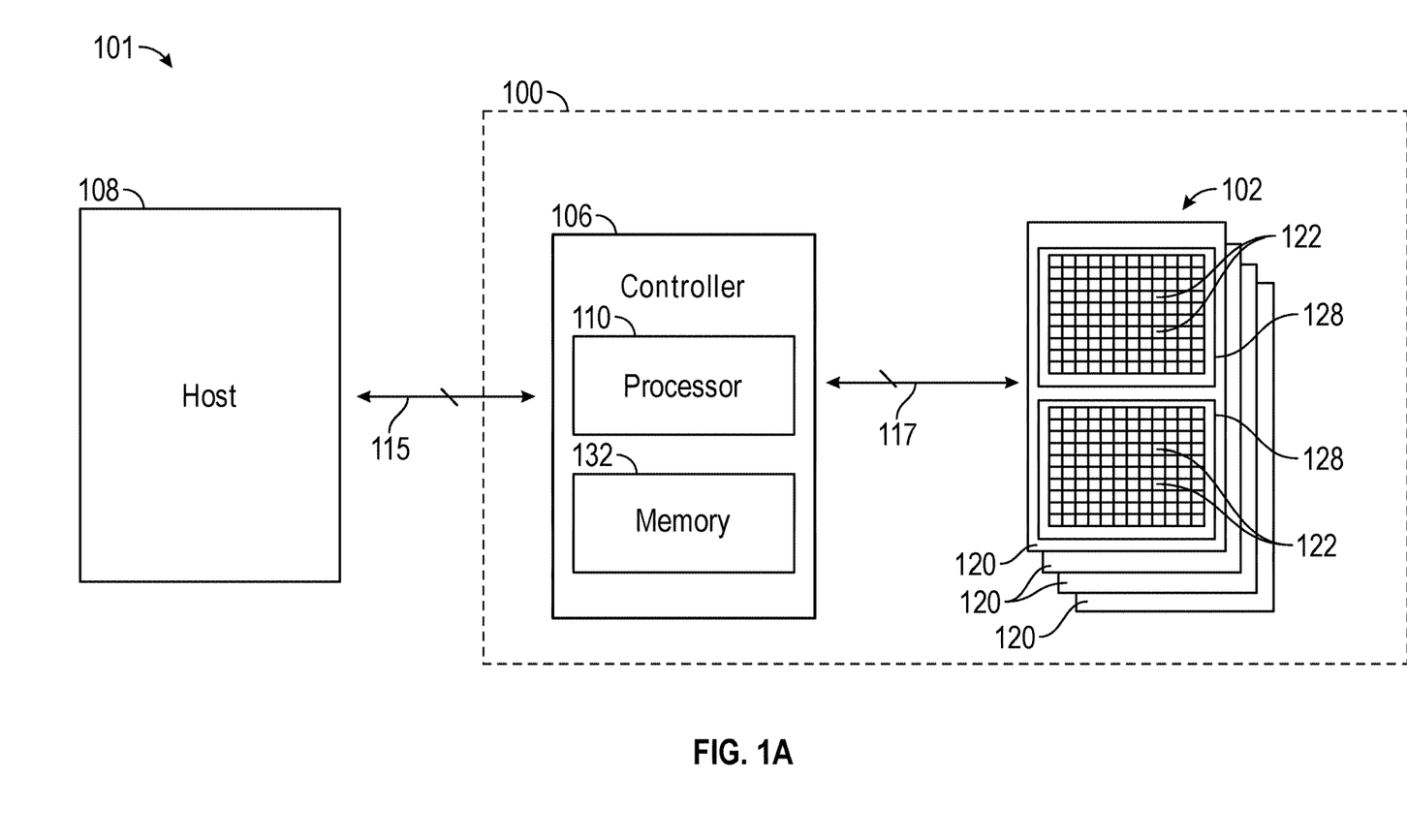
FIG. 1A is a partially schematic block diagram of a system having a memory device configured in accordance with various embodiments of the present technology.

B. Selected Embodiments of Memory Systems and Devices with Source Plate Discharge Circuits, and Associated Methods FIG. 1 is a block diagram of a system 101 having a memory device 100 configured in accordance with an embodiment of the present technology. An example of a memory device 100 is a storage system, such as a solid-state drive (SSD). In some embodiments, the memory device 100 is a hybrid memory/storage sub-system.

As shown, the memory device 100 includes a main memory 102 (e.g., a memory array) and a controller 106 (e.g., a processing device) operably coupling the main memory 102 to a host device 108 (e.g., an upstream central processor (CPU)). The controller 106 can be a microcontroller, special purpose logic circuitry (e.g., a field programmable gate array (FPGA), an application specific integrated circuit (ASIC), etc.), or another suitable processor. The controller 106 can include a processor 110 configured to execute instructions stored in memory. The processor 110 can be a processing device. In the illustrated example, the controller 106 includes an embedded memory 132 configured to store various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. In operation, the controller 106 can directly read, write, or otherwise program (e.g., erase) the various memory regions of the main memory 102, such as by reading from and/or writing to groups of memory cells 122 (e.g., memory pages, stripes of memory pages, memory blocks 128, etc.).

The controller 106 communicates with the host device 108 over a system bus 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets)

to the controller 106. A request can include a command to write, erase, return information, and/or to perform a particular operation (e.g., a TRIM operation). In some embodiments, the host device 108 can send various vendor specific (VS) commands to perform one or more restricted operations (e.g., access a restricted region of the main memory 102, enter a debugging mode, reset restricted data, etc.).

The main memory 102 can include a plurality of memory regions, or memory units 120, which include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. In one example, the memory cells 122 are arranged in memory pages that are arranged in memory blocks 128. Continuing with this example, the memory blocks 128 can be arranged in memory planes, and the memory planes can be arranged in memory dies. As a specific example, the memory cells 122 can include NAND flash storage elements arranged in a 3D NAND topology, configuration, or architecture. The main memory 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106 via a device bus 117.

Figure 1B:
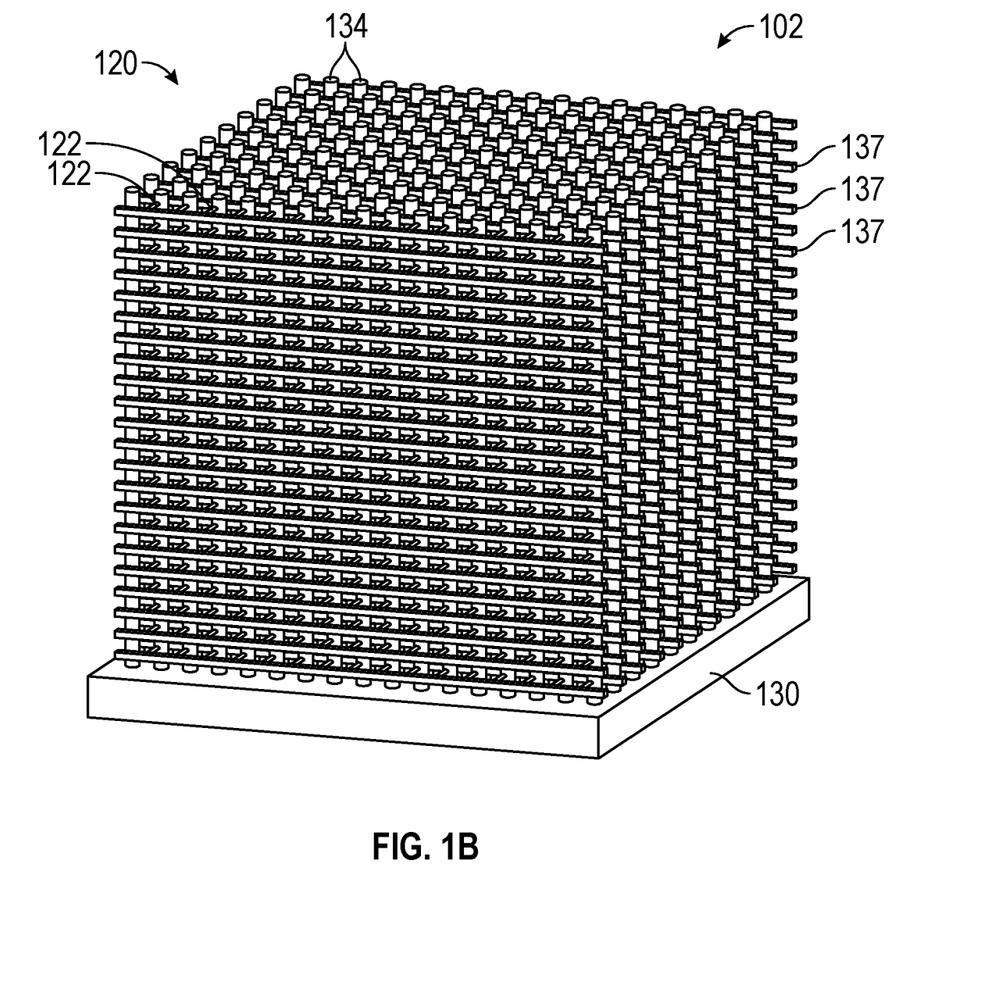
FIG. 1B is a partially schematic diagram of a memory plane in a memory array configured in accordance with various embodiments of the present technology.

FIG. 1B is a partially schematic, simplified diagram of a memory unit 120 (e.g., a memory plane) of the main memory 102. As shown, the memory unit 120 includes a plurality of word lines 134, a plurality of bit lines 137, and a source plate 130. The memory unit 120 can include other well-known components and electrical connections. These other components and electrical connections, however, have not been illustrated in FIG. 1B so as to avoid unnecessarily obscuring aspects of the present technology.

The plurality of word lines 134 in FIG. 1B are arranged such that they intersect (e.g., such that are electrically coupled to) the plurality of bit lines 137. Memory cells 122 are positioned at or near these intersections. In addition, the word lines 134 of the memory unit 120 intersect (e.g., are electrically coupled to) the source plate 130. The source plate 130 serves as a common electrical contact for the word lines 134 of the memory unit 120, and therefore is relatively large in size. As such, the source plate 130 has a relatively large capacitance in comparison to other components of the memory device 100.

As discussed above, the source plate 130 is commonly used to manage or access (e.g., read, write, erase, etc.) the memory cells 122 of the memory unit 120. For example, during an erase operation of a memory region (e.g., a memory block 128) of the memory unit 120, memory cells 122 of the memory region can each be programmed to the same logic state. For example, the memory device 100 can ramp the source plate 130 to a high voltage to pull word lines 134 corresponding to the memory region and intersecting the source plate 130 to the high voltage, thereby enabling the memory device 100 to erase the memory cells 122 of the memory region. The memory device 100 can then drop the voltage at the source plate 130 to ground or another low voltage to, for example, perform a test read to determine how much of the memory region has been successfully erased. The memory device 100 can repeat this procedure (e.g., ramping the source plate 130 to the high voltage to pull intersecting word lines 134 to the high voltage, dropping the voltage at the source plate 130 to ground or to the other low voltage, and performing a test read) as needed until, for example, each memory cell 122 of the memory region has been successfully erased.

Each time the source plate 130 is ramped to the high voltage, the voltage at the source plate 130 often must be dropped back down to ground or to another lower voltage before the memory device 100 can perform various other operations (e.g., read, write, and/or other operations). In addition, in certain situations, the memory device 100 may need to quickly drop the voltage at the source plate 130 to ground or another low voltage. For example, the memory device 100 may need to interrupt an erase operation in the event the memory device 100 is experiencing a brownout or other power problem. As another example, the memory device 100 may need to interrupt an erase operation to perform one or more other (e.g., more urgent, important, time-sensitive, etc.) operations. Memory devices 100 of the present technology therefore include a discharge circuit electrically coupled to the source plate 130 to facilitate quickly dropping the voltage at the source plate 130.

Figure 2A:
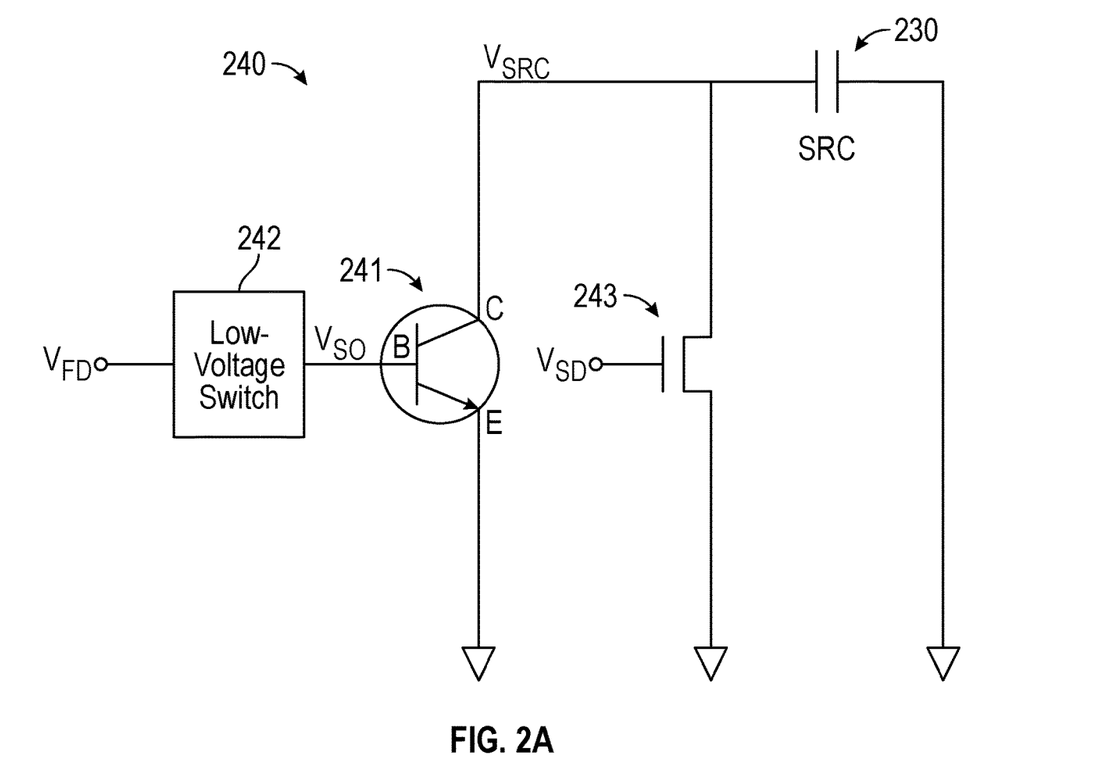
FIG. 2A is a partially schematic circuit diagram of a discharge circuit configured in accordance with various embodiments of the present technology.

FIG. 2A is a partially schematic circuit diagram of a discharge circuit 240 configured in accordance with various embodiments of the present technology. As shown, the circuit 240 includes a bipolar junction transistor (BJT) device 241 having a collector terminal electrically coupled to a source plate 230 (e.g., the source plate 130 of FIG. 1B) and an emitter terminal electrically coupled to ground. As discussed in greater detail below, the BJT device 241 can be operated using a low-voltage switch 242 to drop a voltage $V_{SRC}$ at the source plate 230 to ground or to another low voltage. The low-voltage switch 242 can be electrically coupled to a base terminal of the BJT device 241. In some embodiments, the circuit 240 can additionally include a HV NMOS device 243 electrically coupled to the source plate 230 in parallel with the BJT device 241. As discussed in greater detail below, the HV NMOS device 243 can (a) be fed a control signal (e.g., a standard or default discharge voltage signal $V_{SD}$) and (b) be used to drop the voltage $V_{SRC}$ at the source plate 230 to ground or another low voltage (e.g., when the voltage $V_{SRC}$ is below a first threshold and/or after the BJT device 241 drops the voltage $V_{SRC}$ below a second threshold).

Although not shown in FIG. 2A, the circuit 240 can include one or more other components in some embodiments. For example, the circuit 240 can include one or more resistors electrically positioned (a) between the source plate 230 and the collector terminal of the BJT device 241, (b) between the low-voltage switch 242 and the base terminal of the BJT device 241, (c) between the ground and the emitter terminal of the BJT device 241, (d) between the source plate 230 and the HV NMOS device 243, and/or (e) at other locations within the circuit 240. In these and other embodiments, the circuit 240 can include more than one BJT device 241 and/or more than one HV NMOS device 243 (e.g., electrically coupled in parallel to the source plate 230, to the low-voltage switch 242, and/or to the standard discharge voltage signal $V_{SD}$). Additionally, or alternatively, the circuit 240 can omit the HV NMOS device 243 in some embodiments.

Figure 2B:
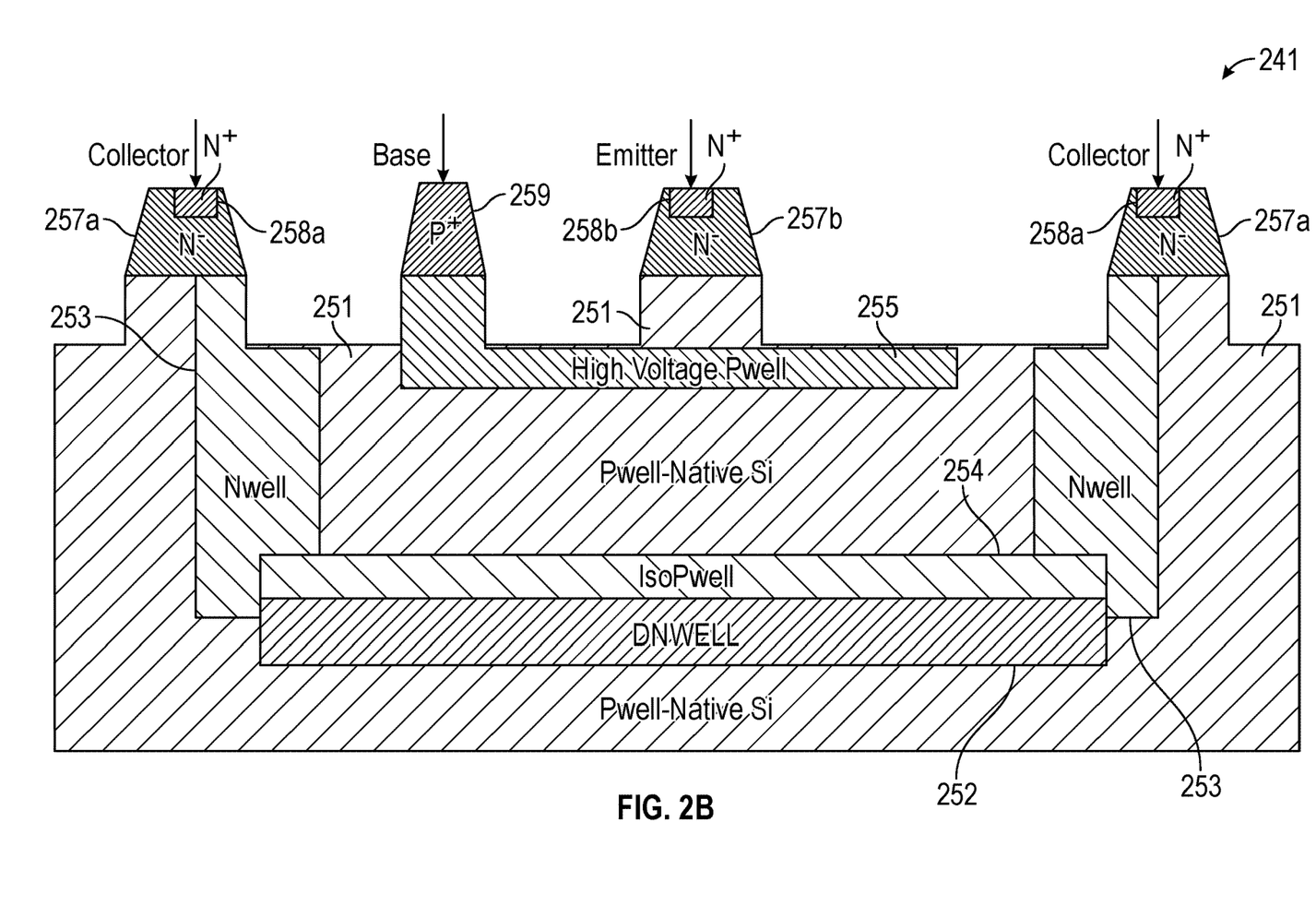
FIG. 2B is a partially schematic cross-sectional view of a bipolar junction transistor configured in accordance with various embodiments of the present technology.

FIG. 2B is a partially schematic cross-sectional view of the BJT device 241 of FIG. 2A. As shown, the BJT device 241 is an NPN transistor with a deep N-well, triple-well configuration. More specifically, the BJT device 241 of FIG. 2B includes a deep N-well region 252, an isolated P-well region 254, and an N-well region 253 formed in P-substrate 251. In some embodiments, the isolated P-well region 254 includes low or light doping. In these and other embodiments, the BJT device 241 can include little to no doping inside of the triple well. The low doping of the isolated P-well region 254 and/or the little to no doping inside of the triple well of the BJT device 241 can enable the BJT device 241 to maintain a high voltage (e.g., ≥20V, such as ≥30V) at the collector terminal of the BJT device 241 without breakdown to a P$^+$ region 259 of the BJT device 241 that serves as an electrode or electrical contact for the base terminal of the BJT device 241.

The BJT device 241 further includes a ring-shaped N$^-$ region 257a formed on the N-well region 253 and outside of the P-substrate 251. This can enable the BJT device 241 to maintain a high voltage (e.g., ≥20V, such as ≥30V) at the collector terminal of the BJT device 241 without breakdown to the P-substrate 251. An N$^+$ region 258a is formed in the ring-shaped N$^-$ region 257a. The N$^+$ region 258a serves as an electrode or electrical contact for the collector terminal of the BJT device 241.

In addition, the BJT device 241 includes a high-voltage P-well region 255 formed in the P-substrate 251. An N$^-$ region 257b is formed above the high-voltage P-well region 255, and an N$^+$ region 258b is formed in the N$^-$ region 257b. The N$^+$ region 258b serves as an electrode or electrical contact for the emitter terminal of the BJT device 241.

The P$^+$ region 259 of the BJT device 241 is also formed over the high-voltage P-well region 255. As discussed above, the P$^+$ region 259 serves as the electrode for the base terminal of the BJT device 241. In some embodiments, the footprint of this P$^+$ region 259 can be relatively small (e.g., ≤1 μm×1 μm), which can reduce the overall footprint of the BJT device 241 and can enable the BJT device 241 to maintain a high collector-base breakdown voltage. Additionally, or alternatively, the spacing between the base terminal and the emitter terminal of the BJT device 241 can be relatively small (e.g., 170-200 nm) because a relatively low voltage (e.g., ≤3V) is required for the BJT device 241 to operate as intended. This can further contribute to reducing the overall footprint of the BJT device 241.

As discussed above, the overall footprint of the BJT device 241 can be relatively small. For example, the overall footprint of the BJT device 241 can be less than or equal to 10 μm×10 μm, such as less than or equal to (a) 5 μm×5 μm or (b) 2.5 μm×2.5 μm. In some embodiments, the small size of the BJT device 241 contributes to a relatively large breakdown voltage. The small overall footprint of the BJT device 241 can also contribute to a small overall footprint of the circuit 240 (FIG. 2A), especially in comparison to a chain of diode-configuration HV NMOS devices that are used in many memory devices to drop the voltage at a source plate.

As discussed in greater detail below, the BJT device 241 can be used to discharge large amounts of current to quickly drop the voltage $V_{SRC}$ (FIG. 2A) at the source plate 230 (FIG. 2A). Thus, the collector, base, and/or emitter terminals of the BJT device 241 can (a) be formed of and/or (b) be electrically coupled to ground, one another, and/or other components of the circuit 240 (FIG. 2A) using metals or other conductors with electromigration properties that can sustain or withstand high current densities.

Although a deep N-well, triple well, NPN BJT device 241 is illustrated and discussed above with respect to FIGS. 2A and 2C, different BJT devices 241 can be used in the circuit 240 (FIG. 2A) in other embodiments. For example, the circuit 240 can include a PNP BJT device in some embodiments. Additionally, or alternatively, the circuit 240 can employ a BJT device with a configuration other than deep N-well or triple-well. One or more of the regions of the BJT device 241 illustrated in FIG. 2B can be omitted in some embodiments. In these and other embodiments, the arrangement of one or more of the regions relative to one another can be different than shown in FIG. 2B, and/or the BJT device 241 can include additional regions than shown in FIG. 2B.

Figure 2C:
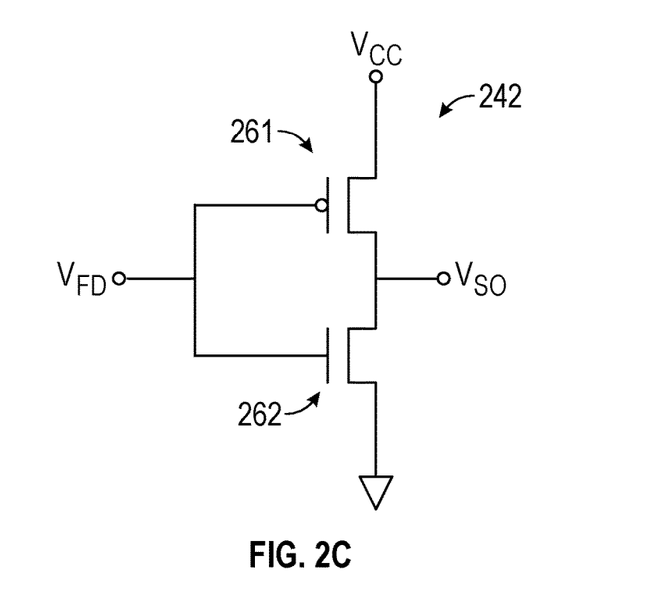
FIG. 2C is a partially schematic circuit diagram of a low-voltage switch configured in accordance with various embodiments of the present technology.

FIG. 2C is a partially schematic circuit diagram of one example of a low-voltage switch 242 that can be used in the circuit 240 of FIG. 2A to control the BJT device 241. As shown, the low-voltage switch 242 is an inverter having a PMOS device 261 and an NMOS device 262 electrically coupled to one another between a common collector voltage $V_{CC}$ and ground. The gates of the PMOS device 261 and the NMOS device 262 can each be fed a control signal, such as a fast discharge voltage signal $V_{FD}$. In operation, an output voltage $V_{SO}$ of the switch 242 is (a) pulled to the common collector voltage $V_{CC}$ when the fast discharge voltage signal $V_{FD}$ is low, and (b) pulled to ground when the fast discharge voltage signal $V_{FD}$ is high.

The low-voltage switch 242 of FIG. 2C is a simple circuit and therefore has a relatively small overall footprint due at least in part to being primarily formed of only two transistors. This can contribute to a relatively small overall footprint of the circuit 240 of FIG. 2A. In some embodiments, the BJT device 241 (FIGS. 2A and 2B) of the circuit 240 can require a small amount of current to activate the BJT device 241 and/or trigger an avalanche mode of operation. In these embodiments, the channels of the PMOS device 261 and the NMOS device 262 can be narrow, and/or the PMOS device 261 and the NMOS device 262 can be integrated on the same device. This can further reduce the size of the low-voltage switch 242. Although the low-voltage switch 242 is shown as a simple inverter in FIG. 2C, other low-voltage switch circuits 242 can be used to control the BJT device 241 in other embodiments of the present technology.

Figure 3A:
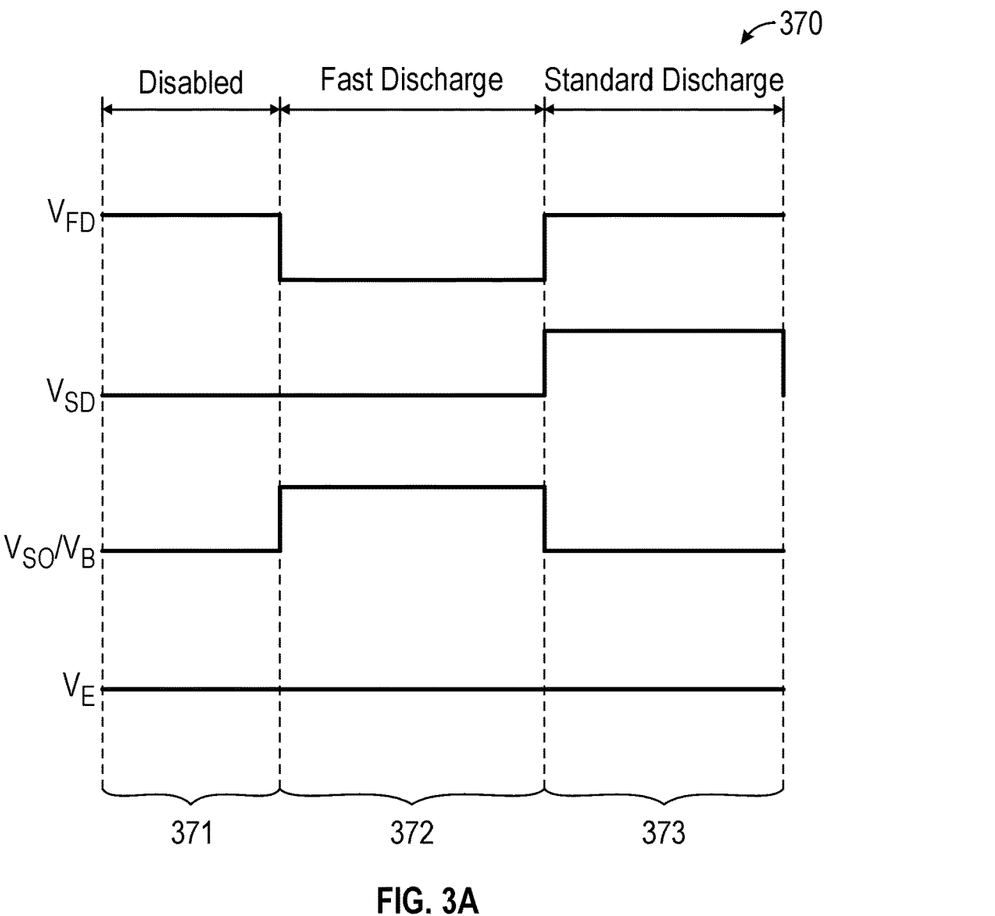
FIG. 3A is a timing diagram of discharge control signals in accordance with various embodiments of the present technology.
Figure 3B:
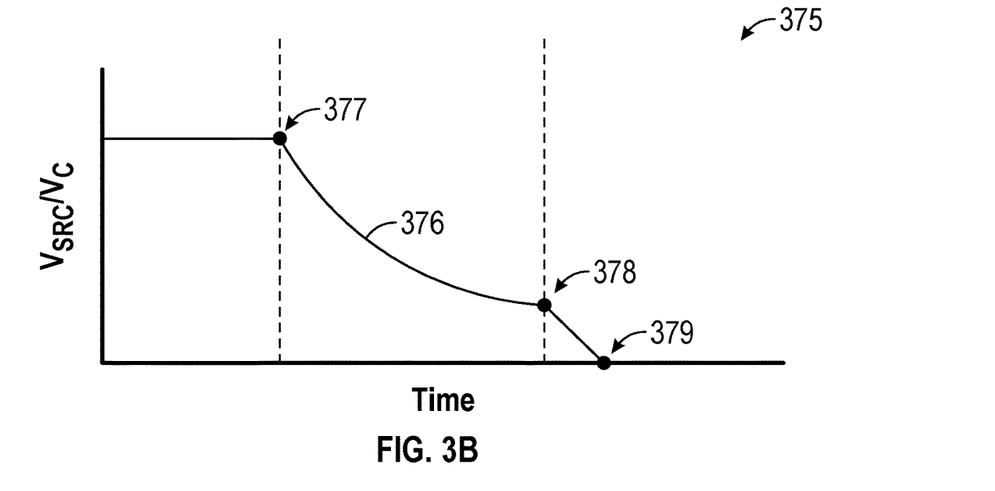
FIG. 3B is a line plot illustrating voltage at a source plate over time in accordance with various embodiments of the present technology.

FIG. 3A is a timing diagram 370 of the fast discharge voltage/control signal $V_{FD}$ (FIGS. 2A and 2C) and of the standard discharge voltage/control signal $V_{SD}$ (FIG. 2A), in accordance with various embodiments of the present technology. FIG. 3A also illustrates (a) changes to the switch output voltage $V_{SO}$ (corresponding to a voltage $V_B$ at the base terminal of the BJT device 241 of FIG. 2A) as the fast discharge voltage signal $V_{FD}$ is toggled between states, and (b) a voltage $V_E$ at the emitter terminal of the BJT device 241 that remains at a ground voltage because the emitter terminal of the BJT device 241 in the circuit 240 (FIG. 2A) is grounded. In addition, FIG. 3B is a line plot 375 illustrating a voltage over time curve 376. The line plot 375 corresponds to the timing diagram 370 of FIG. 3A. In particular, the curve 376 illustrates the voltage $V_{SRC}$ at the source plate 230 of FIG. 2A over time. Because the voltage $V_{SRC}$ at the source plate 230 also corresponds to a voltage $V_C$ at the collector terminal of the BJT device 241, the curve 376 of FIG. 3B also illustrates the voltage $V_C$ at the collector terminal of the BJT device 241 over time.

Referring to FIGS. 2A and 3A, when the fast discharge voltage signal $V_{FD}$ is high and the standard discharge voltage signal $V_{SD}$ is low (as is illustrated in region 371 of the timing diagram 370), the discharge circuit 240 is disabled. In particular, the HV NMOS device 243 of the circuit 240 is in an "off" state. Thus, little to no current passes through the HV NMOS device 243. In addition, the voltage $V_{SO}$ at the output of the switch 242 (corresponding to a voltage $V_B$ at the base terminal of the BJT device 241 in the circuit 240) is pulled to ground, shorting the PN diode formed between the base and the emitter of the BJT device 241. When the voltage $V_{SRC}$ at the source plate 230 (corresponding to the voltage $V_C$ at the collector terminal of the BJT device 241) is greater than the voltage $V_{SO}$ at the output of the switch 242 (as is the case when the source plate 230 is ramped to a voltage above ground during the region 371 of the timing diagram 370 of FIG. 3A), the PN diode between the base and the collector of the BJT device 241 is reverse-biased. The voltage $V_{SRC}$ at the source plate 230 drops across this reverse-biased PN diode. As such, little to no current passes through the BJT device 241. (It is expected that any leakage current between the collector and the base of the BJT device 241 will be minimal and reversed-biased and will pass through the low-voltage switch 242 to ground.) Therefore, current is not discharged via the circuit 240 during the region 371 of the timing diagram 370 of FIG. 3A. For this reason, the region 371 of the timing diagram 370 is also referred to herein as "the disabled region 371."

Referring to FIGS. 3A and 3B, a first portion of the curve 376 in FIG. 3B (e.g., the portion of the curve 376 to the left of point 377) corresponds to the region 371 of the timing diagram 370 in FIG. 3A during which the circuit 240 (FIG. 2A) is disabled. Because no current is discharged through the circuit 240 during the region 371, the voltage $V_{SRC}$ at the source plate 230 does not drop but instead remains constant in FIG. 3B. Alternatively, the memory device 100 (FIG. 1A) can ramp the voltage $V_{SRC}$ at the source plate 230 during the region 371 (e.g., to perform an erase or other operation), in which case the first portion of the curve 376 in FIG. 3B would have a positive slope.

Referring again to FIGS. 2A and 3A, during a region 372 of the timing diagram 370, the memory device 100 can toggle the fast discharge voltage signal $V_{FD}$ from a high to a low state. In turn, this pulls the voltage $V_{SO}$ at the output of the switch 242 (corresponding to the voltage $V_B$ at the base terminal of the BJT device 241) to the common collector voltage $V_{CC}$ or to another voltage supplied by the low-voltage switch 242. At this point, the voltage $V_B$ at the base terminal of the BJT device 241 is greater than the voltage $V_E$ at the grounded emitter terminal of the BJT device 241. As such, the PN diode between the base and the emitter of the BJT device 241 is forward-biased, and electrons are injected into the base of the BJT device 241 from the emitter of the BJT device 241. Thus, current flows between the base and the emitter of the BJT device 241.

It is expected that little to no (e.g., a negligible, inconsequential, or zero amount of) current will back flow from the base of the BJT device 241 toward the power source of the low-voltage switch 242. Nevertheless, care can be taken in some embodiments to ensure that the voltage $V_B$ at the base of the BJT device 241 does not exceed the common collector voltage $V_{CC}$ or another voltage that the low-voltage switch 242 supplies to the base terminal of the BJT device 241 to activate the BJT device 241. Such care can reduce the likelihood of a large amount (e.g., a non-negligible, consequential, or non-zero amount of) current back flowing toward the power source of the low-voltage switch 242 and/or altering the voltage (e.g., $V_{CC}$) supplied by the power source.

When the voltage $V_{SRC}$ at the source plate 230 (corresponding to the voltage $V_C$ at the collector terminal of the BJT device 241) is greater than the voltage $V_B$ at the base terminal of the BJT device 241, the PN diode between the base and the collector of the BJT device 241 is reverse-biased creating an electric field in a base-collector depletion region. Electrons injected into the base from the emitter therefore diffuse through the base to the collector of the BJT device 241. Thus, current flows between the collector and the emitter of the BJT device 241. In other words, when (a) the voltage $V_C$ at the collector of the BJT device 241 is greater than the voltage $V_B$ at the base of the BJT device 241, and (b) the voltage $V_B$ at the base is greater than the voltage $V_E$ at the emitter of the BJT device 241, the BJT device 241 enters an active region of operation and current flows through the BJT device 241. In some embodiments, the BJT device 241 has a relatively large beta value (e.g., a beta value of approximately 1000, meaning that one electron flows between the emitter and the base of the BJT device 241 for every 1000 electrons that flow between the emitter and the collector of the BJT device 241). As current is discharged through the BJT device 241, the voltage $V_{SRC}$ at the source plate 230 drops.

The voltage $V_{SRC}$ at the source plate 230 (corresponding to the voltage $V_C$ at the collector terminal of the BJT device 241) effects the strength of the electric field generated in the base-collector depletion region of the BJT device 241. A strong electric field in the base-collector depletion region of the BJT device 241 can cause a carrier multiplication breakdown of the BJT device 241 due to impact ionization as electrons are injected from the emitter into the base and diffuse through the base to the collector of the BJT device 241. This is referred to as an avalanche mode of operation of the BJT device 241. During the avalanche mode of operation, the amount of current passing between the collector and the emitter of the BJT device 241 can rapidly increase over time as instances of impact ionization lead to further instances of impact ionization.

If the voltage $V_C$ at the collector of the BJT device 241 (corresponding to the voltage $V_{SRC}$ at the source plate 230) remained constant or increased, operating the BJT device 241 in the avalanche mode of operation could cause problems, such as snapback, latchup, current injection, damage and/or other problems on the BJT device 241 and/or on neighboring devices. As current flows through the BJT device 241 of the circuit 240 during the avalanche mode of operation, however, the voltage $V_{SRC}$ at the source plate 230 rapidly drops. In turn, the strength of the electric field generated in the base-collector depletion region of the BJT device 241 rapidly decreases. Thus, the avalanche mode of operation of the BJT device 241 is controlled. As such, the circuit 240 is expected to avoid the various problems that can otherwise occur while operating the BJT device 241 in avalanche mode. The discharge circuit 240 of the present technology can therefore leverage the avalanche mode of operation of the BJT device 241 to rapidly drop the voltage $V_{SRC}$ at the source plate 230 in a controlled manner whenever (a) the voltage $V_{SRC}$ at the source plate 230 is ramped to a value (e.g., ≥20V, such as ≥30V) equal to or greater than the breakdown voltage of the BJT device 241 (e.g., to perform an erase or other operation) and (b) the BJT device 241 is thereafter transitioned to its active region of operation.

Referring to FIGS. 3A and 3B, a second portion of the curve 376 between point 377 and point 378 in FIG. 3B corresponds to the region 372 of the timing diagram 370 of FIG. 3A. As shown in FIG. 3B, the voltage $V_{SRC}$ at the source plate 230 rapidly drops during the fast discharge region 372 (FIG. 3A) as a result of current flowing through the BJT device 241 of the circuit 240 (e.g., while the BJT device 241 operates in the active region and/or in avalanche mode). For this reason, the region 372 of the timing diagram 370 is also referred to herein as "the fast discharge region 372." The voltage $V_{SRC}$ at the source plate 230 can continue to drop during the fast discharge region 372 until either (a) the voltage $V_{SRC}$ is dropped to the voltage $V_B$ at the base terminal of the BJT device 241 (e.g., to the switch output voltage VSO or the common collector voltage $V_{CC}$ (or another voltage) supplied to the base terminal of the BJT device 241 by the low-voltage switch 242), or (b) the fast discharge voltage signal $V_{FD}$ is toggled from low to high. Toggling the fast discharge voltage signal $V_{FD}$ from low to high deactivates the BJT device 241.

In some embodiments, a duration of the fast discharge region 372 (FIG. 3A) can be on the order of tens of microseconds in total time. As discussed above, discharge procedures of many other memory devices can take on the order of hundreds of microseconds in total time to achieve a similar drop in the voltage $V_{SRC}$ at a source plate that can be achieved during the first discharge region 372 using a BJT device 241 of the present technology. Thus, the discharge circuit 240 of the present technology is expected to reduce the duration of a discharge procedure of a source plate by approximately a factor of 10 or more in comparison to the durations of discharge procedures of other memory devices. In turn, a memory device configured in accordance with the present technology can more quickly perform test reads during erase operations after ramping the source plate 230 to high-voltage values to erase memory cells, which is expected to shorten the overall duration of erase operations of the memory device. Additionally, or alternatively, a memory device configured in accordance with the present technology can more quickly perform other operations (e.g., read or write operations) after performing erase or other operations that involve ramping the source plate 230 to a voltage. In these and still other embodiments, a memory device configured in accordance with the present technology can more quickly drop the voltage $V_{SRC}$ at the source plates 230 to ground or another low voltage in response to brown-out or other power conditions on the memory devices and/or in response to various interrupt commands (e.g., erase interrupt commands) received from a host device or a memory controller, or issued internally within the memory device.

Referring again to FIGS. 2A and 3A, during a region 373 of the timing diagram 370 of FIG. 3A, both the fast discharge voltage signal $V_{FD}$ and the standard discharge voltage signal $V_{SD}$ can be toggled from their respective low states to their respective high states. In FIG. 3A, the toggling of the first discharge voltage signal $V_{FD}$ is illustrated as occurring simultaneous to the toggling of the standard discharge voltage signal $V_{SD}$. In other embodiments, the toggling of the voltage signals $V_{FD}$ and $V_{SD}$ can occur in sequence, with either of the signals $V_{FD}$ and $V_{SD}$ being toggled first.

Toggling the fast discharge voltage signal $V_{FD}$ from low to high pulls the voltage signal $V_{SO}$ at the output of the switch 242 (corresponding to the voltage $V_B$ at the base terminal of the BJT device 241) to ground, thereby deactivating the BJT device 241. Toggling the standard discharge voltage signal $V_{SD}$ from low to high activates the HV NMOS device 243 (FIG. 2A) of the discharge circuit 240, thereby (a) allowing current to flow through the HV NMOS device 243 and (b) dropping the voltage $V_{SRC}$ at the source plate 230 to ground. At the end of the region 373 in the timing diagram 370 of FIG. 3A, the standard discharge voltage signal $V_{SD}$ can be toggled from the high state to the low state, thereby disabling the HV NMOS device 243 and returning the discharge circuit 240 to the disabled state.

Referring to FIGS. 3A and 3B, a third portion of the curve 376 after point 378 corresponds to the standard discharge region 373 of FIG. 3A. The portion of the curve 376 in FIG. 3B between point 378 and point 379 illustrates a drop in the voltage $V_{SRC}$ at the source plate 230 to ground as a result of current flowing through the HV NMOS device 243 of FIG. 2A. The voltage $V_{SRC}$ at the source plate 230 can be held at ground after point 379 in the curve 376 (e.g., until the end of the standard discharge region 373 of FIG. 3A).

As discussed in greater detail below, the discharge circuit 240 can enable the standard discharge region 373 (FIG. 3A) whenever the voltage $V_{SRC}$ at the source plate 230 is below a first threshold voltage value. The first threshold voltage value can be set to a value (e.g., 10V or less) at or below which there is little likelihood that the HV NMOS device 243 will experience snapback, latchup, current injection, damage, or other problems as a result of current flowing through the HV NMOS device 243 while dropping the voltage $V_{SRC}$ at the source plate 230. In these and other embodiments, the discharge circuit 240 can switch from the fast discharge region 372 (FIG. 3A) to the standard discharge region 373 whenever the discharge circuit 240 drops the voltage $V_{SRC}$ at the source plate 230 to a second threshold voltage value using the BJT device 241. The second threshold voltage value can be the voltage $V_{SO}$ at the output of the low-voltage switch 242 (e.g., the common collector voltage $V_{CC}$) and/or the voltage $V_B$ at the base of the BJT device 241. Additionally, or alternatively, the second threshold voltage value can be voltage value (e.g., 5.6V) at or below the first threshold voltage value.

In these and still other embodiments, the discharge circuit 240 can drop the voltage $V_{SRC}$ at the source plate 230 using the HV NMOS device 243 whenever the voltage $V_{SRC}$ at the source plate 230 is at or below the first and/or second threshold voltage values. For example, when the voltage $V_{SRC}$ at the source plate 230 is at or below the first and/or second threshold voltage values, the discharge circuit 240 can activate the HV NMOS device 243 (a) in lieu of activating the BJT device 241 and/or (b) without first activating the BJT device 241. In these and still other embodiments, the circuit 240 can use the BJT device 241 to drop the voltage $V_{SRC}$ at the source plate 230 to a low (e.g., non-zero or non-ground) voltage value (e.g., at or near the voltage $V_B$ at the base of the BJT device 241) without thereafter activating the HV NMOS device 243 to drop the voltage $V_{SRC}$ at the source plate 230 to ground or another low voltage.

Figure 4A:
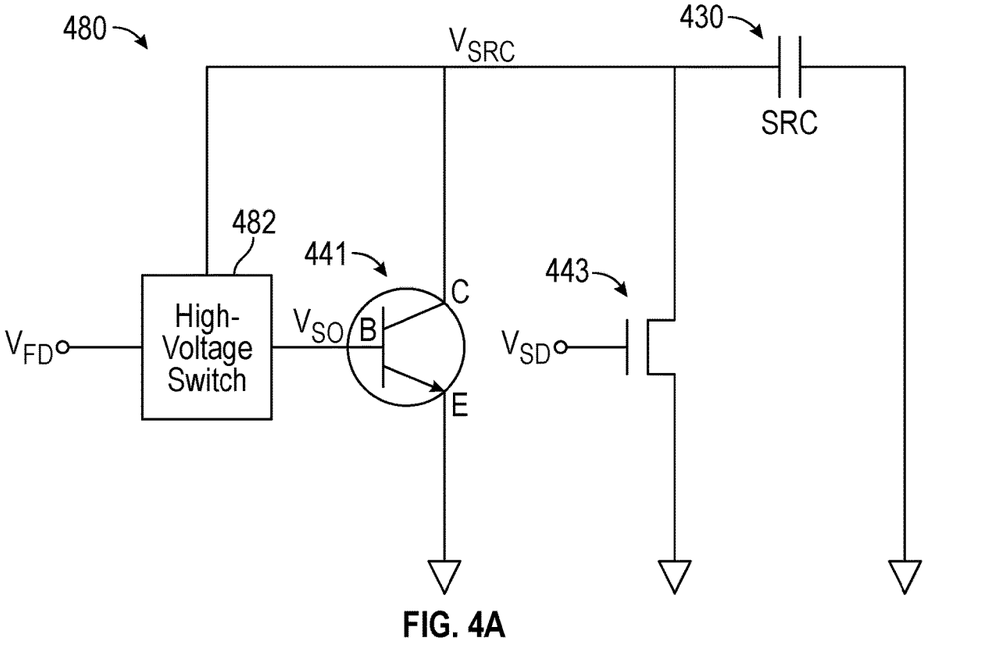
FIG. 4A is a partially schematic circuit diagram of another discharge circuit configured in accordance with various embodiments of the present technology.

FIG. 4A is a partially schematic circuit diagram of another source plate discharge circuit 480 configured in accordance with various embodiments of the present technology. As shown, the circuit 480 includes a bipolar junction transistor (BJT) device 441, a high-voltage switch 482, and a HV NMOS device 443. The BJT device 441 is electrically positioned within the circuit 480 in a manner similar to how the BJT device 241 is electrically positioned in the circuit 240 of FIG. 2A. For example, a collector terminal of the BJT device 441 of FIG. 4A is electrically coupled to a source plate 430 (e.g., to the source plate 130 of FIG. 1B, to the source plate 230 of FIG. 2A, and/or to another source plate), an emitter terminal of the BJT device 441 is electrically coupled to ground, and a base terminal of the BJT device 441 is electrically coupled to the switch 482. In some embodiments, the BJT device 441 can be identical or similar to the BJT device 241 of FIGS. 2A and/or 2B. Thus, in these embodiments, the BJT device 441 can operate generally consistent with the discussion of the BJT device 241 above. In other embodiments, the BJT device 441 can be different from the BJT device 241 and/or can operate differently from the BJT device 441.

Additionally, or alternatively, the HV NMOS device 443 of the circuit 480 can be identical or similar to the HV NMOS device 243 of FIG. 2A. Thus, in these embodiments, the HV NMOS device 443 of FIG. 4A can operate generally consistent with the discussion of the HV NMOS device 243 above. In other embodiments, the HV NMOS device 443 can be different from the HV NMOS device 243 and/or can operate differently from the HV NMOS device 243.

Unlike the low-voltage switch 242 of the circuit 240 of FIGS. 2A and/or 2C, the high-voltage switch 482 of the circuit 480 of FIG. 4A is electrically coupled to the source plate 430 in parallel with the BJT device 441 and/or the HV NMOS device 443. This arrangement can reduce or eliminate the concern that current will back flow into a power supply voltage of the switch 482 and/or otherwise alter a voltage supplied to the circuit 480 from the switch 482.

Although not shown in FIG. 4A, the circuit 480 can include one or more other components in some embodiments. For example, the circuit 480 can include one or more resistors electrically positioned (a) between the source plate 430 and the collector terminal of the BJT device 441, (b) between the high-voltage switch 482 and the base terminal of the BJT device 441, (c) between the ground and the emitter terminal of the BJT device 441, (d) between the source plate 430 and the HV NMOS device 443, (e) between the source plate 430 and the high-voltage switch 482, and/or (f) at other locations within the circuit 480. In these and other embodiments, the circuit 480 can include more than one BJT device 441 and/or more than one HV NMOS device 443 (e.g., electrically coupled in parallel to the source plate 430, to the high-voltage switch 482, and/or to the standard discharge voltage signal $V_{SD}$). Additionally, or alternatively, the circuit 480 can omit the HV NMOS device 243 in some embodiments.

Figure 4B:
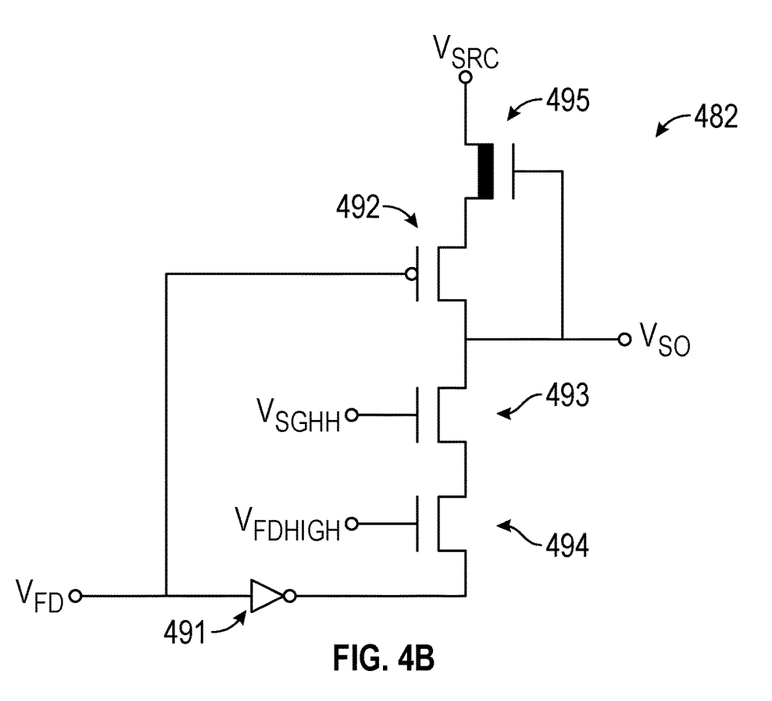
FIG. 4B is a partially schematic circuit diagram of a high-voltage switch configured in accordance with various embodiments of the present technology.

FIG. 4B is a partially schematic circuit diagram of one example of a high-voltage switch 482 that can be used in the circuit 480 of FIG. 4A to control the BJT device 441. As shown, the high-voltage switch 482 includes a low-voltage inverter 491, a high-voltage PMOS device 492, a high-voltage NMOS device 493, a low-voltage NMOS device 494, and a high-voltage depletion mode NMOS device 495. The inverter 491 and the gate of the PMOS device 492 are each fed a fast discharge voltage signal $V_{FD}$. As discussed in greater detail below, the fast discharge voltage signal $V_{FD}$ can be a control signal that is toggled between a low state (e.g., 0V or ground) and a high state (e.g., 3.6V).

The gate of the low-voltage NMOS device 494 is tied to a voltage $V_{FDHIGH}$ (e.g., 3.6V) equivalent to the voltage of the high state of the fast discharge voltage signal $V_{FD}$. The gate of the high-voltage NMOS device 493 is tied to a constant voltage $V_{SGHH}$ (e.g., 5.8V) that can be greater than the voltage $V_{FDHIGH}$ to which the gate of the low-voltage NMOS device 494 is tied. The high-voltage NMOS device 493 and the low-voltage NMOS device 494 are arranged in a cascode configuration to reduce or eliminate the possibility of snapback problems arising when the inverter 491 inverts the fast discharge voltage signal $V_{FD}$ to the low state.

The source of the depletion-mode NMOS device 495 is electrically coupled in series to the source of the PMOS device 492. The gate of the depletion-mode NMOS device 495 is electrically coupled to the drain of the PMOS device 492 and to the high-voltage NMOS device 493. In addition, the gate of the depletion-mode NMOS device 495 can be electrically coupled to the base terminal of the BJT device 441 of FIG. 4A. Thus, the voltage at this location in the switch 482 can be considered the output voltage $V_{SO}$ of the switch 482. The drain of the depletion-mode NMOS device 495 can be electrically coupled to the source plate 430 of FIG. 4A and in parallel with the BJT device 441 and the HV NMOS device 443.

In some embodiments, the BJT device 441 (FIG. 4A) of the circuit 480 can require a small amount of current to move it into its active region of operation and/or to trigger its avalanche mode of operation. In these embodiments, the channels of the PMOS device 492, the high-voltage NMOS device 493, the low-voltage NMOS device 494, and/or the depletion mode NMOS device 495 can be narrow. Additionally, or alternatively, the PMOS device 492, the high-voltage NMOS device 493, the low-voltage NMOS device 494, and/or the depletion mode NMOS device 495 can be integrated on the same device. This can reduce the size of the high-voltage switch 482. The high-voltage switch 482 illustrated in FIG. 4B is but one example of a high-voltage switch that can be used to control the BJT device 441 (FIG. 4A). In other embodiments of the present technology, other high-voltage switch circuits 482 can be used to control the BJT device 441.

The fast discharge voltage/control signal $V_{FD}$ and the standard discharge voltage/control signal $V_{SD}$ (FIG. 4A) can be toggled in a manner generally consistent with the discussion above with respect to FIG. 3A. Thus, current is not discharged via the circuit 480 when the fast discharge voltage signal $V_{FD}$ is high and the standard discharge voltage signal $V_{SD}$ is low. For example, referring to FIGS. 4A and 4B together, when the fast discharge voltage signal $V_{FD}$ is in its high state (e.g., 3.6V), the high-voltage PMOS device 492 of the high-voltage switch 482 is "off," and the inverter 491 of the high-voltage switch 482 can output a voltage (e.g., 0V or ground) equivalent to the low state of the fast discharge voltage signal $V_{FD}$. This can pull the switch output voltage $V_{SO}$ (corresponding to the voltage $V_B$ at the base terminal of the BJT device 441) to the low voltage (e.g., 0V or ground) output from the inverter 491. As discussed above, with respect to FIGS. 2A-3B, current does not flow through the BJT device 441 in this scenario.

On the other hand, when the fast discharge voltage signal $V_{FD}$ is toggled to the low state (e.g., 0V or ground), the inverter 491 of the high-voltage switch 482 outputs a voltage (e.g., 3.6V) equivalent to the high state of the fast discharge voltage signal $V_{FD}$, thereby turning the low-voltage NMOS device 494 "off." The low state of the fast discharge voltage signal $V_{FD}$ turns the high-voltage PMOS device 492 "on." This can pull the switch output voltage $V_{SO}$ (corresponding to the voltage $V_B$ at the base terminal of the BJT device 441) towards the positive voltage $V_{SRC}$ at the source plate 430. As discussed above, a positive voltage at the base terminal of the BJT device 441 in the circuit 480 can move the BJT device 441 into its active region of operation. When the voltage $V_{SRC}$ at the source plate 430 is at a value equal to or greater than the breakdown voltage of the BJT device 441, a positive voltage at the base terminal of the BJT device 441 can trigger the avalanche mode of operation of the BJT device 441. Thus, a large amount of current can be discharged through the BJT device 441.

More specifically, a resistive network with a plurality of current paths can be used to discharge current when the BJT device 441 is moved into its active region of operation. These current paths can include (a) a path extending between the source plate 430 and the base terminal of the BJT device 441 through the depletion mode NMOS device 495 and the high-voltage PMOS device 492 of the high-voltage switch 482; (b) a path extending between the source plate 430 and the base terminal of the BJT device 441 through the collector terminal of the BJT device 441; (c) a path extending between the base terminal of the BJT device 441 and ground through the emitter terminal of the BJT device 441; and/or (d) a path extending between the base terminal of the BJT device 441 and ground through the high-voltage NMOS device 493 and the low-voltage NMOS device 494 (at least in embodiments in which this path is grounded or connected to the low state of the fast discharge voltage signal $V_{FD}$). The first two of the above-listed paths can be electrically connected in parallel with one another, and/or the last two of the above-listed paths can be electrically connected in parallel within one another. Furthermore, the two sets of parallel paths can be connected in series with one another via the base terminal of the BJT device 441 such that the voltage at a center node of the resistive network can be the switch output voltage $V_{SO}$.

When the fast discharge voltage signal $V_{FD}$ is toggled to the low state (e.g., 0V or ground), the switch output voltage $V_{SO}$ can be pulled toward the voltage $V_{SRC}$ at the source plate 430 via to the feedback mechanism in the high-voltage switch 482 between the high-voltage PMOS device 492 and the high-voltage depletion mode NMOS device 495. This can move the BJT device 441 into its active mode of operation and/or into its avalanche mode of operation, causing the voltage $V_{SRC}$ at the source plate 430 to rapidly drop as current is discharged through all or a subset of the current paths of the resistive network described above. As the switch output voltage $V_{SO}$ approaches the voltage $V_{SRC}$ at the source plate 430, current continues to be discharged through all or the subset of the current paths of the resistive network, and both the switch output voltage $V_{SO}$ and the voltage $V_{SRC}$ at the source plate 430 can drop in accordance with ratios defined by the resistive network. Current continues to be discharged through the high-voltage PMOS device 492 as long as (i) the switch output voltage $V_{SO}$ is greater than a threshold voltage $V_T$ of the high-voltage PMOS device 492 and (ii) the gate of the high-voltage PMOS device 492 remains grounded or supplied with the low state of the fast discharge voltage signal $V_{FD}$. The voltage $V_{SRC}$ at the source plate 430 can therefore be dropped until the voltage $V_{SRC}$ reaches ground or until the fast discharge voltage signal $V_{FD}$ is toggled from the low state to the high state.

In the event the fast discharge voltage signal $V_{FD}$ is toggled from the low state to the high state before the voltage $V_{SRC}$ at the source plate 430 is grounded, the standard discharge voltage signal $V_{SD}$ can be toggled from a low state to a high state. This can activate the HV NMOS device 443 and drop the voltage $V_{SRC}$ at the source plate 430 to ground or another voltage. Alternatively, current can be permitted to flow (e.g., to continue flowing) through the inverter 491, the low-voltage NMOS device 494, and/or the high-voltage NMOS device 493 of the high-voltage switch 482 to drop the remaining voltage $V_{SRC}$ at the source plate 430 to ground or to another voltage (e.g., a voltage equivalent to the low state of the fast discharge voltage signal $V_{FD}$).

Figure 5:
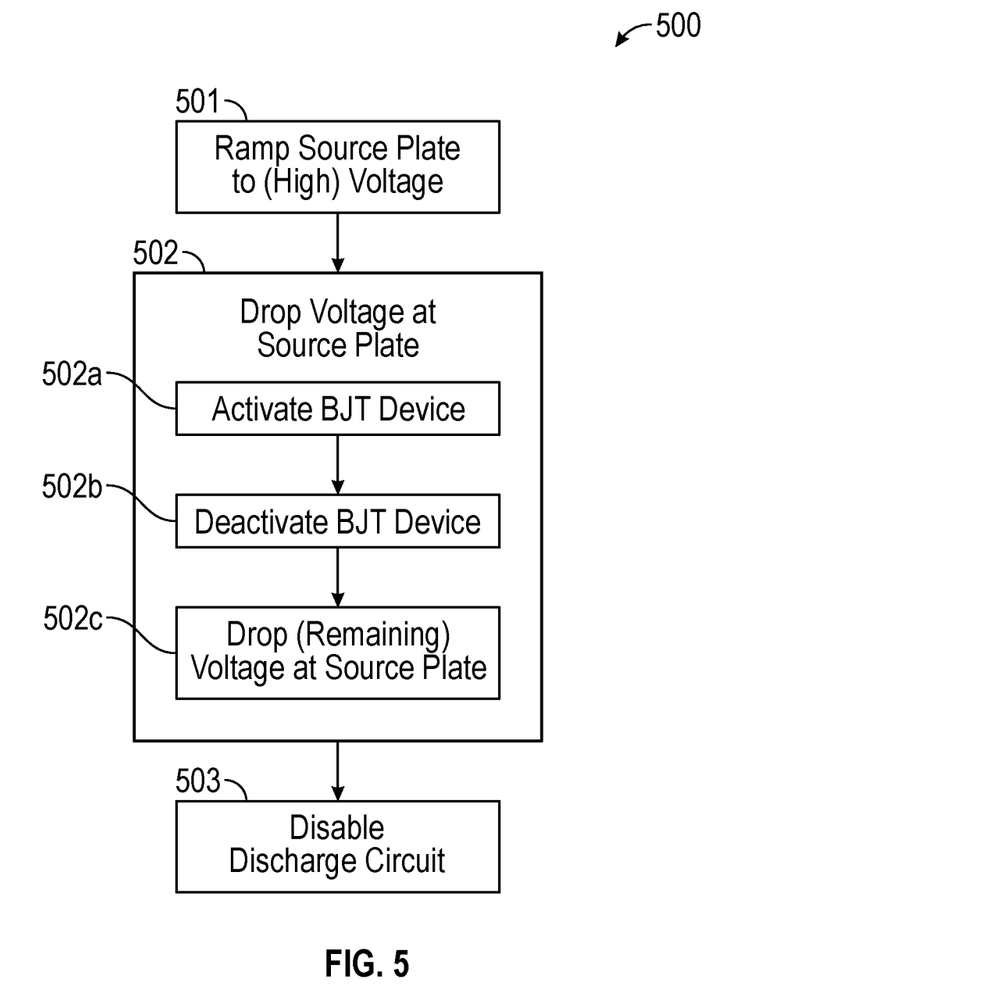
FIG. 5 is a flow diagram illustrating a discharge routine in accordance with various embodiments of the present technology.

FIG. 5 is a flow diagram illustrating a routine 500 for discharging a source plate in accordance with various embodiments of the present technology. In some embodiments, all or a subset of one or more of the steps of the routine 500 can be executed by various components of a memory system, such as the memory system 101 of FIG. 1. For example, all or a subset of one or more steps of the routine 500 can be executed by a host device, a memory controller, a memory device, a discharge circuit, a source plate, and/or other components of the memory system. In these and other embodiments, all or a subset of one or more of the steps of the routine 500 can be executed by a manufacturer or a user of the memory system, such as by the manufacturer or a user of the memory device. Furthermore, any one or more of the steps of the routine 500 can be executed in accordance with the discussion above and/or in accordance with the discussion of FIG. 6 below.

At block 501, the routine 500 begins by ramping a source plate to a voltage. In some embodiments, a memory device can ramp the source plate to the voltage to perform an erase operation on memory cells corresponding to word lines that intersect the source plate. In these and other embodiments, the memory device can ramp the source plate to the voltage to perform an operation other than an erase operation, such as a read or write operation. The voltage can be a non-zero or non-ground voltage. In these and other embodiments, the voltage can be a voltage at or above a breakdown voltage of a BJT device included in a discharge circuit operably connected (e.g., electrically coupled directly or indirectly) to the source plate. In these and still other embodiments, the source plate can be ramped to the voltage while the discharge circuit is disabled (e.g., while the discharge circuit is not discharging current).

At block 502, the routine 500 continues by dropping the voltage at the source plate. In some embodiments, a memory device drops the voltage at the source plate as part of the memory device executing an operation. For example, while executing an erase operation, a memory device can drop the voltage at the source plate to perform a test read to determine how many memory cells in a memory region have been successfully erased and/or to determine whether additional iterations of the erase operation are required to successfully erase all of the memory cells in the memory region. In these and other embodiments, a memory device can drop the voltage at the source plate after (e.g., immediately after) executing an operation. For example, after executing an erase operation, the memory device can drop the voltage at the source plate such that the memory device can proceed to (e.g., immediately) execute another operation, such as a read or write operation. In these and still other embodiments, the voltage at the source plate can be dropped in response to certain conditions on the memory device. For example, a memory device can drop the voltage at the source plate in response to identifying or experiencing a brownout or other power-related condition of the memory device. As another example, a memory device can drop the voltage at the source plate in response to a command to interrupt or abort an operation. Continuing with this example, the memory device can ramp the source plate at block 501 to perform an erase operation. While executing the erase operation, the memory device can receive an interrupt command instructing the memory device to interrupt or abort the erase operation (e.g., to execute another, more urgent or important operation). The interrupt command can be received from a host device or a memory controller operably connected to the memory device, or the interrupt command can be internally generated and issued by the memory device. In response to the interrupt command, the memory device can drop the voltage at the source plate.

To drop the voltage at the source plate, a memory device can activate a discharge circuit operably connected (e.g., electrically coupled directly or indirectly) to the source plate. For example, at subblock 502a of the routine 500, the memory device can activate a BJT device electrically coupled to the source plate in accordance with the discussion above with respect to FIGS. 2A-4B. Continuing with this example, the memory device can activate the BJT device using a fast discharge voltage/control signal (e.g., input into a low-voltage or high-voltage switch that controls the BJT device). The BJT device can be activated by moving it into its active region of operation and/or into its avalanche mode of operation. When the BJT device is activated, current can be discharged through the BJT device to drop the voltage at the source plate.

At subblock 502b, the routine 500 can continue by deactivating the BJT device. For example, the memory device can deactivate the BJT device using the fast discharge voltage/control signal (e.g., input into the low-voltage or high-voltage switch that controls the BJT device). The BJT device can be deactivated by moving it outside of its active region of operation. When the BJT device is deactivated, current is prevented from flowing through the BJT device. In some embodiments, the memory device can deactivate the BJT device after the voltage at the source plate has been dropped to ground or to another low voltage (e.g., to the voltage at the base terminal of the BJT device). In these and other embodiments, the memory device can deactivate the BJT device after the voltage at the source plate has been dropped to at or below a first and/or second threshold voltage value, which are discussed in greater detail below with respect to subblock 502c. In these and still other embodiments, the memory device can deactivate the BJT device at any time after activating the BJT device at subblock 502a (e.g., regardless of the value of the voltage at the source plate).

At subblock 502c, the routine 500 can continue by dropping the voltage at the source plate (e.g., using a method other than activating the BJT device). For example, after dropping the voltage at the source plate using the BJT device at subblock 502a, the memory device can activate an HV NMOS device or another current path (e.g., a current path through the low-voltage or high-voltage switch) to drop any remaining voltage at the source plate to ground or to another low voltage. Continuing with this example, at subblocks 502a and 502b, the memory device can drop the voltage at the source plate to at or below a first and/or a second threshold voltage value. In some embodiments, the first threshold voltage value can be a voltage value (e.g., 10V) at or below which there is little likelihood that snapback or other current-related problems will occur on the HV NMOS device, on devices in the other current path, and/or or on neighboring devices while the voltage at the source plate is dropped. Thus, in these embodiments, the memory device can deactivate the BJT device at subblock 502b once the voltage at the source plate is at or below (a) at least the first threshold voltage value and/or (b) a second threshold voltage value that is less than or equal to the first threshold voltage value. In turn, the memory device can activate the HV NMOS device or the other current path at subblock 502c to drop the remaining voltage at the source plate to ground or another voltage. A standard discharge voltage/control signal can be used to control the HV NMOS device and/or the other current path.

In these and other embodiments, a memory device can drop the voltage at the source plate without first dropping the voltage at the source plate using the BJT device at subblocks 502a and 502b. For example, when the source plate is ramped at block 501 to a voltage at or below the first threshold voltage value, the memory device can drop the voltage at the source plate (e.g., to ground or another voltage) by activating the HV NMOS device or the other current path in lieu of and/or without first activating the BJT device.

At block 503, the routine 500 can continue by disabling the discharge circuit operably connected to the source plate. In some embodiments, disabling the discharge circuit can include preventing the circuit from discharging current and/or otherwise dropping the voltage at the source plate. For example, the memory device can disable the discharge circuit using the fast discharge voltage/control signal to deactivate the BJT device and prevent current from being discharged through the BJT device. Additionally, or alternatively, the memory device can disable the discharge circuit using the standard discharge voltage/control signal to deactivate the HV NMOS device and/or other current path(s) and prevent current from being discharged through the HV NMOS device and/or the other current path(s).

Although the steps of the routine 500 are discussed and illustrated in a particular order, the routine 500 of FIG. 5 is not so limited. In other embodiments, the steps of the routine 500 can be performed in a different order. In these and other embodiments, any of the steps of the routine 500 can be performed before, during, and/or after any of the other steps of the routine 500. Furthermore, a person skilled in the art will readily recognize that the routine 500 can be altered and still remain within these and other embodiments of the present technology. For example, one or more steps of the routine 500 can be omitted and/or repeated in some embodiments.

Figure 6:
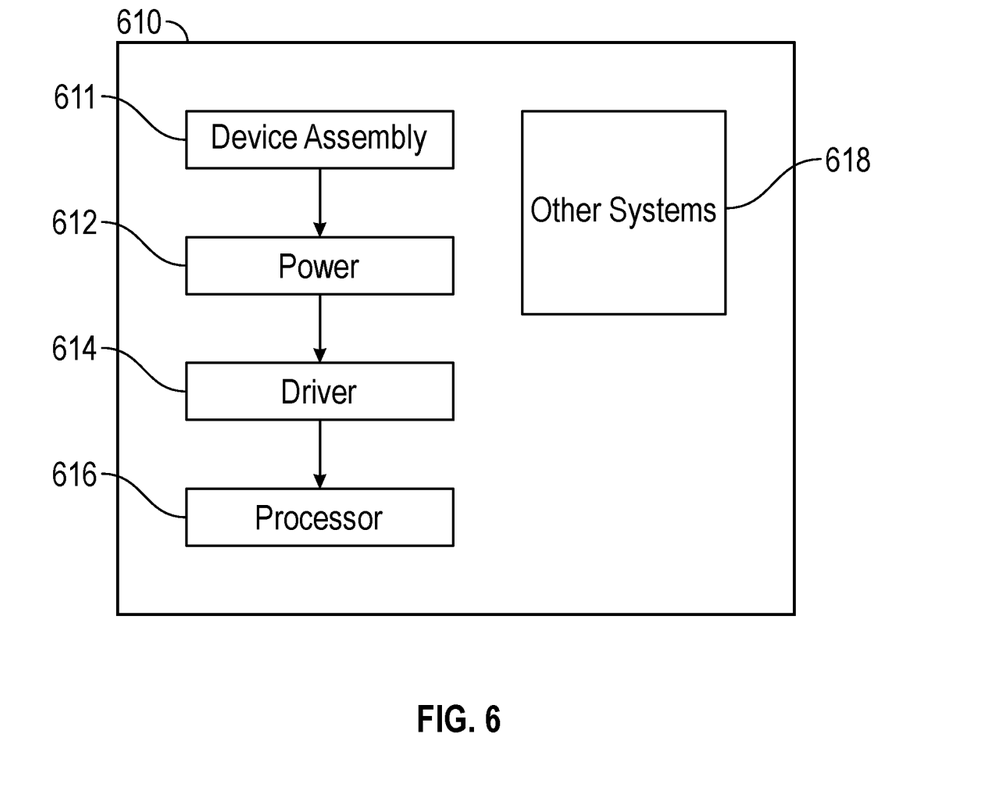
FIG. 6 is a schematic view of a system that includes a memory device in accordance with various embodiments of the present technology.

FIG. 6 is a schematic view of a system that includes a memory device in accordance with various embodiments of the present technology. Any one of the foregoing memory devices described above with reference to FIGS. 1-5 can be incorporated into any of a myriad of larger and/or more complex systems, a representative example of which is system 610 shown schematically in FIG. 6. The system 610 can include a semiconductor device assembly 611, a power source 612, a driver 614, a processor 616, and/or other subsystems and components 618. The semiconductor device assembly 611 can include features generally similar to those of the memory devices described above with reference to FIGS. 1-5, and can, therefore, include various features of dropping voltages at source plates. The resulting system 610 can perform any of a wide variety of functions, such as memory storage, data processing, and/or other suitable functions. Accordingly, representative systems 610 can include, without limitation, hand-held devices (e.g., mobile phones, tablets, digital readers, and digital audio players), computers, vehicles, appliances, and other products. Components of the system 610 may be housed in a single unit or distributed over multiple, interconnected units (e.g., through a communications network). The components of the system 610 can also include remote devices and any of a wide variety of computer-readable media.

C. Conclusion

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. As used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same feature(s) and/or additional types of other features are not precluded. Moreover, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. As another example, various components of the technology can be further divided into subcomponents, and/or various components and/or functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the present technology.

It should also be noted that other embodiments in addition to those disclosed herein are within the scope of the present technology. For example, embodiments of the present technology can have different configurations, components, and/or procedures in addition to those shown or described herein. Moreover, a person of ordinary skill in the art will understand that these and other embodiments can be without several of the configurations, components, and/or procedures shown or described herein without deviating from the present technology. Accordingly, the disclosure and associated technology can encompass other embodiments not expressly shown or described herein.

We claim:

1. A memory device, comprising:
   a plurality of memory cells;
   a source plate electrically coupled to the plurality of memory cells; and
   a discharge circuit including a bipolar junction transistor device electrically coupled to the source plate,
   wherein the bipolar junction transistor device is configured to drop a voltage at the source plate by discharging current through the bipolar junction transistor device.

2. The memory device of claim 1, wherein the bipolar junction transistor device is an NPN bipolar junction transistor device.

3. The memory device of claim 1, wherein the bipolar junction transistor device is a deep n-well, triple well bipolar junction transistor device.

4. The memory device of claim 1, wherein:
   the bipolar junction transistor device includes a collector terminal electrically coupled to the source plate; and
   the bipolar junction transistor device includes a grounded emitter terminal.

5. The memory device of claim 1, wherein:
   the discharge circuit further comprises a low-voltage switch having an output electrically coupled to a base terminal of the bipolar junction transistor device; and
   the low-voltage switch is configured to activate and deactivate the bipolar junction transistor device by moving the bipolar junction transistor device into and out of, respectively, its active region of operation.

6. The memory device of claim 1, wherein:
   the discharge circuit further includes a high-voltage switch having (a) an output electrically coupled to a base terminal of the bipolar junction transistor device and (b) an input electrically coupled to the source plate such that the high-voltage switch is electrically positioned in parallel with the bipolar junction transistor device; and
   the high-voltage switch is configured to active and deactivate the bipolar junction transistor device by moving the bipolar junction transistor device into and out of, respectively, its active region of operation.

7. The memory device of claim 1, wherein the plurality of memory cells is arranged in a three-dimensional (3D) NAND-flash topology.

8. A method, comprising dropping a voltage at a source plate of a memory device using a discharge circuit having a bipolar junction transistor electrically coupled to the source plate.

9. The method of claim 8, wherein dropping the voltage at the source plate includes activating the bipolar junction transistor using a low-voltage switch or a high-voltage switch such that current is discharged through the bipolar junction transistor.

10. The method of claim 8, wherein:
    the method further comprises ramping the source plate to the voltage;
    the voltage has a value above a breakdown voltage value of the bipolar junction transistor; and
    dropping the voltage at the source plate includes discharging current through the bipolar junction transistor while the bipolar junction transistor is in an avalanche mode of operation.

11. The method of claim 8, wherein dropping the voltage at the source plate includes activating a high-voltage NMOS device electrically coupled to the source plate such that current is discharged through the high-voltage NMOS device.

12. The method of claim 11, wherein:
    the high-voltage NMOS device is electrically positioned in parallel with the bipolar junction transistor; and
    activating the high-voltage NMOS device includes activating the high-voltage NMOS device after dropping the voltage at the source plate below a threshold voltage value using the bipolar junction transistor.

13. The method of claim 8, wherein dropping the voltage at the source plate includes dropping the voltage at the source plate in response to (a) a brownout or other power-related condition of the memory device and/or (b) a command to interrupt or abort an operation.

14. The method of claim 8, wherein dropping the voltage at the source plate includes dropping the voltage at the source plate during an erase operation of memory cells of the memory device or immediately after executing the erase operation.

15. A circuit, comprising:
a bipolar junction transistor device operably connected to a source plate of a memory device,
wherein the bipolar junction transistor device is configured to discharge current to drop a voltage at the source plate.

16. The circuit of claim 15, wherein the bipolar junction transistor device includes (a) a collector terminal electrically coupled to the source plate and (b) a grounded emitter terminal.

17. The circuit of claim 15, wherein the bipolar junction transistor device includes a base terminal electrically coupled to a low-voltage switch.

18. The circuit of claim 17, wherein the low-voltage switch is a low-voltage inverter comprising an NMOS device and a PMOS device.

19. The circuit of claim 15, wherein:
the bipolar junction transistor device includes a base terminal electrically coupled to a high-voltage switch; and
the high-voltage switch is electrically coupled to the source plate in parallel with the bipolar junction transistor device.

20. The circuit of claim 15, further comprising a high-voltage NMOS device electrically coupled to the source plate in parallel with the bipolar junction transistor device.

* * * * *